(12) United States Patent
Hasuda et al.

(10) Patent No.: US 7,574,932 B2
(45) Date of Patent: Aug. 18, 2009

(54) SAMPLE HOLDING MECHANISM AND SAMPLE WORKING/OBSERVING APPARATUS

(75) Inventors: Masakatsu Hasuda, Chiba (JP); Mamoru Okabe, Chiba (JP)

(73) Assignee: SII Nano Technology Inc., Chiba (JP)

( * ) Notice: Subject to any disclaimer, the term of this patent is extended or adjusted under 35 U.S.C. 154(b) by 293 days.

(21) Appl. No.: 11/701,286

(22) Filed: Jan. 31, 2007

(65) Prior Publication Data
US 2008/0224374 A1  Sep. 18, 2008

(30) Foreign Application Priority Data
Feb. 9, 2006 (JP) ............... 2006-032146

(51) Int. Cl.
*G01N 1/28* (2006.01)
*H01J 37/20* (2006.01)
*G01N 13/10* (2006.01)
*G12B 5/00* (2006.01)
*G12B 21/22* (2006.01)

(52) U.S. Cl. ............... 73/864.91; 73/105; 250/442.11; 269/71; 850/18

(58) Field of Classification Search ............. 73/864.91, 73/105; 250/442.11; 269/71; 850/18
See application file for complete search history.

(56) References Cited

U.S. PATENT DOCUMENTS

| 3,448,265 | A | * | 6/1969 | Samuelson ............... 378/78 |
|---|---|---|---|---|
| 3,801,139 | A | * | 4/1974 | Larson ..................... 281/45 |
| 4,427,891 | A | * | 1/1984 | Georges et al. ...... 250/442.11 X |
| 4,521,119 | A | * | 6/1985 | Stepke et al. ................ 374/56 |
| 6,469,309 | B1 | * | 10/2002 | Kasai .................. 250/442.11 |
| 7,297,311 | B2 | * | 11/2007 | Tamura et al. ............... 422/63 |
| 7,409,914 | B2 | * | 8/2008 | Angood et al. ........ 73/864.91 X |
| 7,491,022 | B2 | * | 2/2009 | Kato et al. ............... 269/71 X |
| 2006/0289784 | A1 | * | 12/2006 | Deguchi et al. ........ 250/441.11 |

FOREIGN PATENT DOCUMENTS

JP    2005-32906 A    2/2005

* cited by examiner

*Primary Examiner*—Thomas P Noland
(74) *Attorney, Agent, or Firm*—Brinks Hofer Gilson & Lione

(57) ABSTRACT

A sample working/observing apparatus possesses a sample holding mechanism. The sample holding mechanism possesses a sample holder holding a sample, and a base detachably supporting the sample holder. Between these, there are detachably provided a rotation support part supporting so as to be rotatable, a slide support part supporting so as to be slidable from a rotation center toward an X-direction, and a butting support part supporting so as to be slidable in the X-direction and a Y-direction. In an upper face, there are provided an X-direction positioning pin and a Y-direction positioning pin, which are disposed along the Y-direction and the X-direction from the rotation center, and butt against one side and the other side of the sample.

8 Claims, 6 Drawing Sheets

SAMPLE HOLDING MECHANISM AND SAMPLE WORKING/OBSERVING APPARATUS

This application claims priority under 35 U.S.C. §119 to Japanese Patent Application No. JP2006-032146 filed Feb. 9, 2006, the entire content of which is hereby incorporated by reference.

BACKGROUND OF THE INVENTION

The present invention relates to a sample holding mechanism used for positioning and holding a sheet-like sample, and a sample working/observing apparatus that comprises the sample holding mechanism and performs working/observation upon the sample.

Up to this point, a photomask used in the manufacture of a liquid crystal flat panel display and the exposure process of semiconductor manufacture has been corrected by a focused ion beam apparatus and the like. In order to precisely work and observe a sample, such as the photomask, or a substrate patterned by the photomask, it is necessary to precisely position the sample inside the focused ion beam apparatus, and it is necessary to resolve the problems associated with an expansion and a contraction due to a temperature change inside or outside of the apparatus. In order to cope with the problems, an exposure apparatus for patterning a substrate or the sample is proposed which has means for raising the atmospheric temperature in a pre-alignment chamber which is provided along a path along which the sample is carried from the outside into the apparatus (e.g., JP-A-2005-32906). In such an exposure apparatus, it is possible to raise the temperature of the substrate in the pre-alignment chamber, using the temperature raising means, during a process for pre-aligning the substrate. Therefore, when evacuating the apparatus, even if the temperature of the substrate changes due to an adiabatic expansion of a gas, it is possible to adjust the temperature of the substrate to the outside air temperature and thereby prevent a distortion of the substrate. Further, it is unnecessary to provide a separate process for the temperature adjustment.

However, in such a case where same-sized samples are carried, it is possible to directly carry the samples by a standardized carrying system as mentioned above. However, in order to carry samples of various sizes, it is necessary to hold them with a sample holder so that the samples will be carried under the same carrying condition. Further, when a sheet-like sample such as a photomask is carried between the outside and the inside of the apparatus, to prevent a flexure of the sample and precisely position the sample, it is necessary to carry the sample while being held by the sample holder. Since the sample holder is formed, e.g., by a metal material or the like, whose rigidity is high, due to the necessity that the sample holder holds the sample, its thermal expansion coefficient is high in comparison with the sample, so that the distortion caused by the temperature change is large. Further, since the heat capacity is large, time is required for the sample holder to become thermally equilibratory with the ambient temperature environment. Therefore, like JP-A-2005-32906, even if the temperature adjustment was made only during the process for pre-aligning, the high heat capacity sample holder cannot be thermally equilibrated. That is, inside the apparatus, the sample holder expands or contracts due to the temperature change and thus the position of the sample held by the sample holder changes (drifts), so that it becomes impossible to perform the precise working and observation.

This invention has been made in view of the above-mentioned problems, and provides a sample holding mechanism which, even if it expands or contracts due to temperature changes, can hold the sample in place to thereby precisely position and hold the sample, and also provides a sample working/observing apparatus having this sample holding mechanism.

SUMMARY OF THE INVENTION

In order to solve the aforementioned problems, this invention proposes the following means.

The present invention relates to a sample holding mechanism that has a mounted sample holder that holds a sheet-like sample on its upper face. A detachable base supports the sample holder, and is characterized in that, between the sample holder and the base, there are detachably provided respectively a rotation support part supporting the sample holder so as to be rotatable with respect to the base, a slide support part supporting the sample holder so as to be slidable with respect to the base from a rotation center of the rotation support part toward a predetermined X-direction, and at least one butting support that supports the sample holder so as to be slidable with respect to the base in the X-direction and a Y-direction intersecting perpendicularly to the X-direction. In the upper face of the sample holder, there are provided an X-direction positioning member disposed along the Y-direction from the rotation center of the rotation support part and positioning the sample in the X-direction while butting against one side of the sample, and a Y-direction positioning member disposed along the X-direction from the rotation center of the rotation support part and positioning the sample in the Y-direction while butting against the other side adjoining the one side of the sample.

According to the sample holding mechanism concerned with this invention, by the fact that the one side of the sample is butted against the X-direction positioning member and the other side is butted against the Y-direction positioning member, the sample can be carried while being positioned on the upper face of the sample holder having been separated from the base. And, under this state, the sample holder is mounted to the base having been provided in a predetermined position. Since the sample holder is supported with respect to the base by at least three points of the rotation support part, the slide support part and the butting support part, it becomes a state having been certainly supported to the base. Further, since movements in the X-direction and the Y-direction are regulated by the rotation support part, and a rotation about an axis perpendicular to the base is regulated by the slide support part, the sample holder becomes a state having been positioned to the base. Here, in a state in which the sample holder has been mounted to the base, the X-direction positioning member of the sample holder is disposed along the Y-direction from the rotation center of the rotation support part, and the Y-direction positioning member is disposed along the X-direction from the rotation center of the rotation support part. Therefore, in the state in which the sample holder has been mounted to the base, the sample becomes a state in which one side has been disposed along the Y-direction, the other side has been disposed along the X-direction, and an intersection point between the one side and the other side has been positioned in a position becoming approximately the same when seen in a plane as the rotation center of the rotation support part.

Further, when carrying the sample holder, and additionally just after the sample holder has been mounted to the base, the temperature of the sample holder changes due to a change in its surrounding environment, so that the sample holder itself expands or contracts. The sample holder is supported by the rotation support part so as to be rotatable with respect to the base. Additionally, it is supported by the slide support part so as to be slidable in the X-direction from the rotation center of the rotation support part and, further, supported by the butting support part so as to be slidable in the X-direction and the Y-direction. Therefore, as to the sample holder, there is no fact that a reaction force acts in accordance with the temperature change, and it can freely deform with the rotation support part being made a center. Further, the X-direction positioning member and the Y-direction positioning member, which have been provided in the upper face of the sample holder, displace respectively in the Y-direction and the X-direction toward the rotation center of the rotation support part. That is, even if the sample holder has expanded or contracted due to the temperature change, the X-direction positioning member and the Y-direction positioning member merely slide with respect to the one side and the other side, of the sample, against which they respectively butt. Therefore, as to the sample, the one side is parallel to the Y-direction, the other side is parallel to the X-direction, and the intersection point between the one side and the other side can always keep the position becoming approximately the same when seen in the plane as the rotation center of the rotation support part.

Further, it is deemed to be more desirable that, in the above sample holding mechanism, in any one of a lower face of the sample holder and an upper face of the base, a convex part is provided in a position corresponding to each of the rotation support part, the slide support part and the butting support part, in the other of the lower face of the sample holder and the upper face of the base, there are formed respectively a fitting concave part fitting to the convex part so as to be rotatable in a position corresponding to the rotation support part. A fitting groove fitting to the convex part is slidable in the X-direction in a position corresponding to the slide support part. Additionally, a butting face butts against the convex part in a position that corresponds to the butting support part. The rotation support part is constituted by the fitting concave part and the corresponding convex part, the slide support part by the fitting groove and the corresponding convex part, and the butting support part by the butting face and the corresponding convex part, respectively.

According to the sample holding mechanism of the present invention, by fitting the convex part and the fitting concave part, which constitute the rotation support part, fitting the convex part and the fitting groove, which constitute the slide support part, and additionally butting the convex part and the butting face, which constitute the butting support part, the sample holder is easily attachable/detachable and supported to the base under a state having been precisely positioned.

Additionally, it is deemed to be more desirable that, in the above sample holding mechanism, a surface shape of each of the convex parts of the rotation support part, the slide support part and the butting support part is formed in a spherical face, the fitting concave part of the rotation support part is formed like a circular cone capable of fitting to the convex part, and the fitting groove of the slide support part is v-shaped and capable of fitting to the convex part.

According to the sample holding mechanism of the invention, because the surface shape of the convex part is formed in the spherical face and the corresponding fitting concave part is formed like the circular cone and the fitting groove is v-shaped, the fitting concave part and the fitting groove can be more easily fitted with respect to the convex parts, and the sample holder can be more precisely positioned with respect to the base.

Further, it is more desirable that, in the above sample holding mechanism, in the upper face of the base, the convex parts are disposed in four places like a square, and, in the lower face of the sample holder, there are disposed the one fitting concave part, the one fitting groove and the two butting faces like the square while corresponding to the convex parts.

According to the sample holding mechanism of the present invention, in the upper face of the base, there are disposed the four convex parts like the square and, in the lower face of the sample holder, there are correspondingly disposed the fitting concave part, the fitting groove and the two butting faces like the square. Therefore, by selecting the convex part to be fitted to the fitting concave part, the sample can be made a different direction at every 90 degrees. That is, if the working and the observation are possible about a range of at least a quarter of the whole sample, it is possible to work and observe the whole sample by changing the direction of the sample by 90 degrees at a time, so that, even if the sample becomes large in size, it is possible to work and observe the whole with a small working/observing range. Incidentally, by the facts that the convex part is provided in the base, and that the fitting concave part constituting the rotation support part is formed in the sample holder to which the sample is held, even if the direction of the sample is changed, a position of the rotation center of the rotation support part and a position of the intersection point between the one side and the other side of the sample can be always made the position becoming approximately the same when seen in the plane. Therefore, even if the sample holder has expanded or contracted due to the temperature change, it is possible to always perform a precise position control with the rotation center of the rotation support part, whose position does not change due to the temperature change, being made a reference point.

Further, it is deemed to be more desirable that, in the above sample holding mechanism, in a center of the base, around which the convex parts have been disposed like the square, there is provided an ascent-and-descent rotation means which pushes up the sample holder having been supported by the base by advancing or retreating in a vertical direction, and can rotate the pushed-up sample holder about an axis vertical with respect to the base.

According to the sample holding mechanism of the present invention, by pushing up the sample holder by using the ascent-and-descent rotation means, it is possible to easily separate the sample holder from the base. Additionally, from this state, the sample holder can be easily mounted to the base by descending the sample holder while rotating it at 90-degree intervals.

Further, the present invention is a sample working/observing apparatus that uses the above sample holding mechanism, and is characterized in that is has a sample chamber in which the sample holding mechanism has been accommodated, a two-axis stage moving the sample holding mechanism having been disposed inside the sample chamber in a horizontal direction, and a working/observing means for performing working/observation of the sample that was held by the sample holder of the sample holding mechanism.

According to the sample working/observing apparatus of the present invention, because the sample is held by the sample holder of the sample holding mechanism, carried to the inside of the sample chamber, and mounted to the base of the sample holding mechanism, it is possible to precisely position the sample in a predetermined position inside the sample chamber. Even if the temperature of the sample holder changes due to temperature differences outside and inside of the sample chamber or the adiabatic expansion due to the fact that the inside of the sample chamber is made the vacuum state, and the like, the sample can be always kept in a position in which the rotation center of the rotation support part is made a reference. That is, by performing the position control with the rotation center of the rotation support part being made the reference, and driving the two-axis stage, it is possible to precisely work or observe a predetermined position of the sample by the working/observing means.

Further, it is more desirable that, in the above sample working/observing apparatus, the working/observing means is a body tube capable of irradiating a charged particle beam to the sample.

According to the sample working/observing apparatus of the present invention, without undergoing temperature change, it is possible to work the sample by precisely irradiating the charged particle beam to a predetermined position from the body tube. Additionally, it is also possible to precisely observe a surface of the sample by detecting secondary electrons generated by irradiating the charged particle beam.

Further, in the above sample working/observing apparatus, the working/observing means may be made as is a probe that is capable of scanning a surface of the sample.

According to the sample working/observing apparatus of the present invention, without undergoing a temperature change, it is possible to precisely scan with the probe a predetermined position of the surface of the sample and further it is possible to obtain a precise observation image.

According to the sample holding mechanism of the present invention, by supporting the sample holder with respect to the base by the rotation support part, the slide support part and the butting support part, and further positioning the sample with respect to the sample holder by the X-direction positioning member and the Y-direction positioning member, even if the sample holder has expanded or contracted due to the temperature change, the position of the sample is not changed, so that it is possible to precisely position and hold the sample. Therefore, even if the sample is carried through environments of varying temperatures, it is unnecessary to provide a facility or time for thermally equilibrating the sample holder, so that it is possible to save space and time, and perform a precise position control of the sample. Further, according to the sample working/observing apparatus including a similar sample holding mechanism, there is no proof that it is affected by the temperature change in the inside/outside of the apparatus, and it is possible to save space and the time, and perform precise working/observation.

DETAILED DESCRIPTION OF THE PREFERRED EMBODIMENT

First Embodiment

Figure 1:
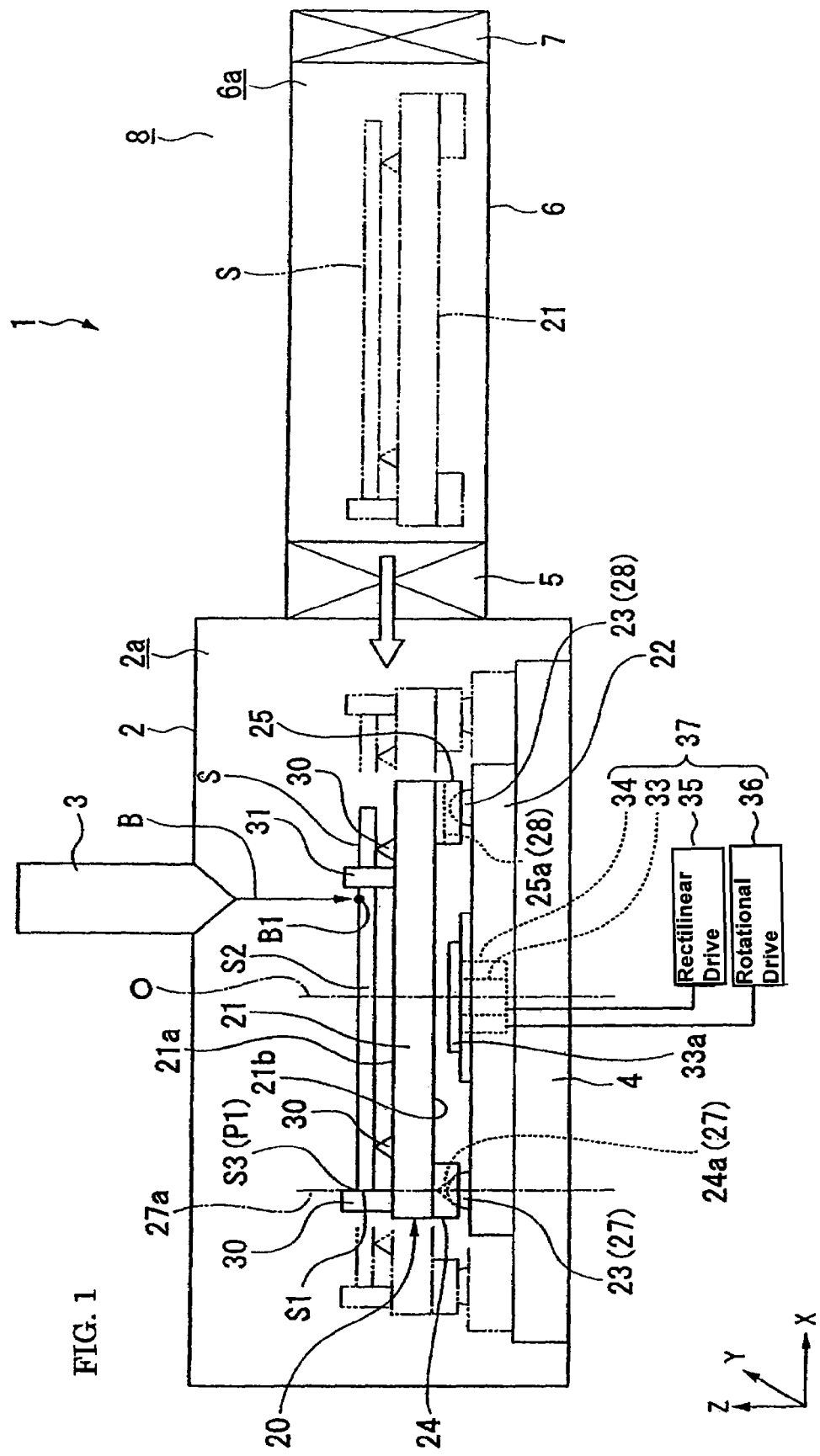
FIG. 1 is a side view of a focused ion beam apparatus of a first embodiment of this invention.

FIG. 1 shows a first embodiment of the invention. As shown in FIG. 1, a focused ion beam apparatus (FIB) 1, which is a sample working/observing apparatus, is used to perform working and observation of the surface of a sample S by irradiating a focused ion beam B1, which is a charged particle beam, onto the sheet-like sample S. In the present embodiment, the sample S may be a photomask used in the manufacture of flat panel displays and the exposure process of semiconductor manufacture. The photomask is corrected by working a predetermined position of the photomask. Hereafter, the details of the focused ion beam apparatus 1 in the present embodiment will be explained.

As shown in FIG. 1, the focused ion beam apparatus 1 includes a sample chamber 2 in which the sample S is accommodated, and a body tube 3 capable of irradiating a focused ion beam B to the sample S at an irradiation position B1. In an inside 2a of the sample chamber 2, there are provided a sample holding mechanism 20 for positioning and holding the sample S, and a two-axis stage 4 for moving the sample holding mechanism 20 on a horizontal plane. Further, in the sample chamber 2, there is provided an openable/closable partition valve 5, which is connected to a load lock chamber 6. Further, in the load lock chamber 6, there is provided an openable/closable partition valve 7, which is connected to an outside 8. Incidentally, in the sample chamber 2 and the load lock chamber 6 respectively, there is provided exhaust means not shown in the figures. Furthermore, insides 2a and 6a can be made a into a vacuum atmosphere.

Figure 2:
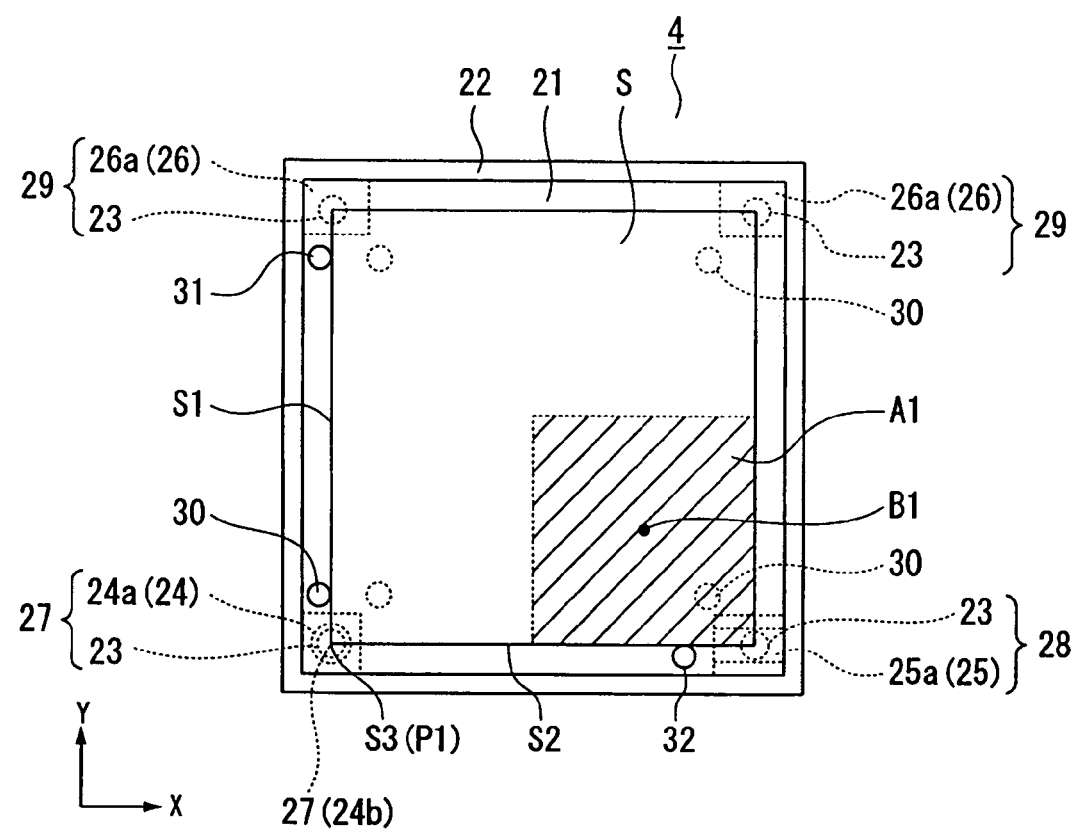
FIG. 2 is a plan view of a sample holding mechanism of the first embodiment of this invention.
Figure 3:
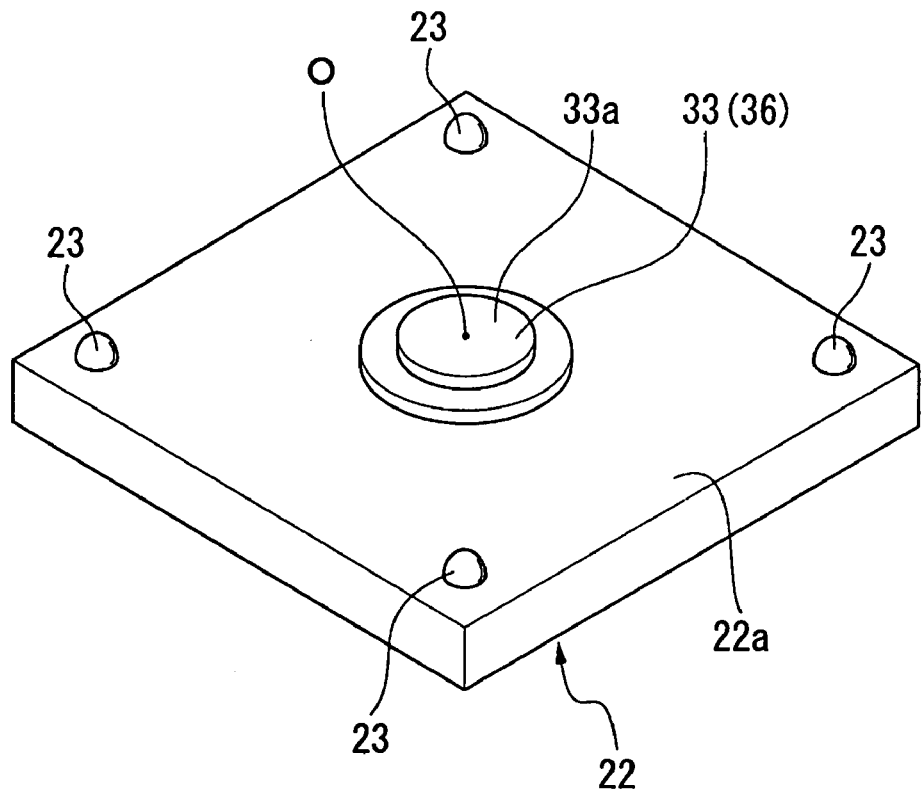
FIG. 3 is a perspective view of a base of the first embodiment of this invention.
Figure 4:
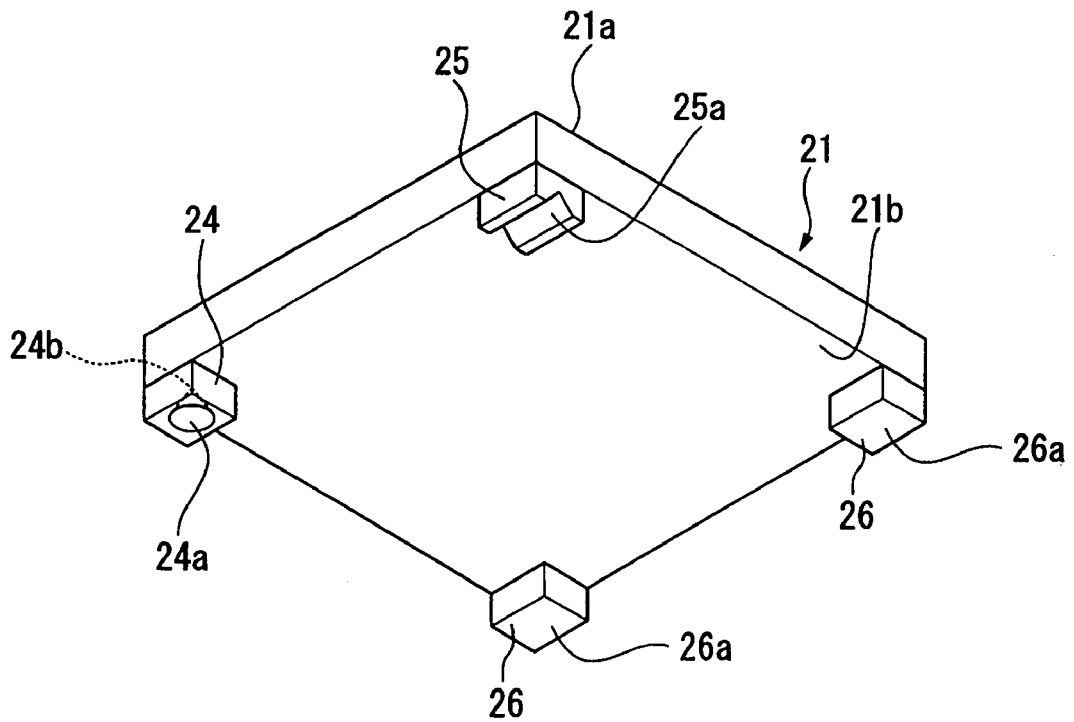
FIG. 4 is a perspective view of a sample holder of the first embodiment of this invention.

As shown in FIG. 1, the sample holding mechanism 20 has a sample holder 21 for mounting and holding the sample S on its upper face 21a, and a base 22 detachably supporting the sample holder 21. As shown in FIG. 2 and FIG. 3, an upper face 22a of the base 22 is formed with four convex parts 23 each having a spherically projecting surface. When the base 22 is placed on the two-axis stage 4, these convex parts 23 are disposed at the four corners of a square aligned in an X-direction that is one direction on the horizontal plane and in a Y-direction perpendicular to the X-direction. Further, as shown in FIG. 2 and FIG. 4, in a lower face 21b of the sample holder 21, there are provided, in positions corresponding to the convex parts 23, one circular cone block 24, one V-block 25 and two flat blocks 26 while being disposed like the square. In the circular cone block 24, there is formed a fitting concave part 24a capable of fitting to the convex part 23 and having been formed like a circular cone. Further, the V-block 25 is disposed in a position adjoining the circular cone block 24, and formed with a fitting groove 25a which can fit to the convex part 23 and whose section is V-shaped. Further, the fitting groove 25a is extensively provided toward a center 24b of the fitting concave part 24a of the circular cone block 24. Further, the flat blocks 26 are disposed in other two places, and formed with butting faces 26a against which the convex parts 23 can butt. And, as shown in FIG. 2, by the fact that one of the convex parts 23 fits to the fitting concave part 24a of the circular cone block 24, there is constituted a rotation support part 27. Further, by the fact that the other one of the convex parts 23 fits to the fitting groove 25a of the V-block 25, there is constituted a slide support part 28. Additionally, by the fact that the other two convex parts 23 butt against the respective butting faces 26a of the two flat blocks 26, there are constituted two butting support parts 29.

The sample holder 21 is supported to the base 22 by a four-point support system consisting of the one rotation support part 27, the one slide support part 28 and the two butting support parts 29. Incidentally, in the initial setting as shown in FIG. 1 and FIG. 2, the direction of the sample holder 21 with respect to the base 22 is set such that the fitting groove 25*a* of the V-block 25 is extensively provided in the X-direction. And, in this state, in the rotation support part 27, since the circular cone-shaped fitting concave part 24*a* merely fits to the convex part 23, it is under an attachable/detachable state, is able to regulate movements in both the X-direction and the Y-direction, and is possible to rotate about a vertical axis with respect to the base 22. Further, in the slide support part 28, since the fitting groove 25*a* whose section is v-shaped fits to the convex part 23, it is removable attached, while regulating the rotation, and is slidable only in the X-direction along which the fitting groove 25*a* extends. Additionally, in the butting support part 29, since the butting face 26*a* merely butts against the convex part 23, it is under the attachable/detachable state and rotatable, and slidable in the X-direction and the Y-direction.

Further, as shown in FIG. 1 and FIG. 2, in the upper face 21*a* of the sample holder 21, there are provided plural support pins 30 supporting the sample S mounted on the upper face 21*a*. Additionally, in the upper face 21*a* of the sample holder 21, there are provided two X-direction positioning pins 31 butting against one side S1 of the sample S to thereby position the sample S in the X-direction, and a Y-direction positioning pin 32 butting against the other side S2 adjoining the one side S1 of the sample S to thereby position the sample S in the Y-direction. Under a state in which the sample holder 21 has been supported to the base 22, the two X-direction positioning pins 31 are disposed along the Y-direction from a rotation center 27*a* of the rotation support part 27. Further, the one Y-direction positioning pin 32 is disposed along the X-direction from the rotation center 27*a* of the rotation support part 27. That is, as to the sample S having been mounted on the upper face 21*a* of the sample holder 21, the one side S1 is disposed parallel to the Y-direction, the other side S2 is disposed parallel to the X-direction, and an intersection point S3 between the one side S1 and the other side S2 is positioned in a position becoming approximately the same when seen in a plane as the rotation center 27*a* of the rotation support part 27.

Further, as shown in FIG. 1, there is provided in the base 22 an ascent-and-descent rotation means 37 having a shaft 33 having been provided in a Z-direction that is a vertical direction, a rotation rectilinear movement guide 34 externally fitted so as to be capable of vertically advancing or retreating the shaft 33 with respect to the base 22 and so as to be capable of rotating about an axis of the shaft 33, a rectilinear movement drive part 35 advancing or retreating the shaft 33 in the Z-direction, and a rotation drive part 36 rotating the shaft 33 about the axis. The shaft 33 is provided in the center O of the square at the four corners of which the convex parts 23 of the base 22 are placed.

Next, the actions of the focused ion beam apparatus 1 and the sample holding mechanism 20 are explained. As shown in FIG. 1, first, the sample holder 21 of the sample holding mechanism 20 and the base 22 are separated; only the sample holder 21 is disposed in the outside 8 of the sample chamber 2, and the sample S is mounted to the upper face 21*a*. As mentioned above, by the fact that the one side S1 of the sample S is butted against the X-direction positioning pin 31 and the other side S2 is butted against the Y-direction positioning pin 32, the sample S is positioned and held in the sample holder 21. Therefore, the sample holder 21 can carry the sample S so as not to be flexed while holding a relative position with the sample S intact. First, the partition valve 7 is opened, and the sample S and the sample holder 21 are carried to the inside 6*a* of the load lock 6 by a carrier robot not shown in the drawing. Next, the partition valve 7 is closed, and the inside 6*a* of the load lock chamber 6 is exhausted and made the vacuum state by an exhaust means not shown in the drawing. Under this state, the partition valve 5 is opened, and the sample S and the sample holder 21 are carried to the inside 2*a* of the sample chamber 2 by the carrier robot not shown in the drawing. And, in the inside 2*a* of the sample chamber 2, the sample holder 21 is mounted to the base 22 which was installed on the two-axis stage 4. That is, the fitting concave part 24*a* of the circular cone block 24 of the sample holder 21 and the fitting groove 25*a* of the V-block 25 are fitted to each of the convex parts 23 of the base 22 and, further, the butting faces 26*a* of the two flat blocks 26 are butted against each of the other convex parts 23 of the base 22.

A surface shape of the convex part 23 is formed in the spherical face, the corresponding fitting concave part 24*a* like the circular cone, and the fitting groove 25*a* is v-shaped. Therefore, even if a position setting of the sample holder 21 by the carrier robot has somewhat deviated, the fitting concave part 24*a* and the fitting groove 25*a* can be easily fitted to the convex parts 23 and, further, the sample holder 21 can be precisely mounted with respect to the base 22. And, there can be made a state in which the sample holder 21 has been certainly supported to the base 22 by the four-point support of the rotation support part 27 by the fitting concave part 24*a* and the corresponding convex part 23, the slide support part 28 by the fitting groove 25*a* and the corresponding convex part 23, and the two butting support parts 29 by the butting faces 26*a* and the corresponding convex parts 23. Further, since movements in the X-direction and the Y-direction are regulated by the rotation support part 27 and a rotation about an axis perpendicular to the base 22 is regulated by the slide support part 23, the sample holder 21 becomes a state having been positioned with respect to the base 22. Additionally, as mentioned above, the sample S becomes a state in which the one side S1 has been disposed along the Y-direction, the other side S2 has been disposed along the X-direction, and the intersection point S3 has been positioned in a position becoming approximately the same when seen in the plane as the rotation center 27*a* of the rotation support part 27. By mounting the sample holder 21 to the base 22, the sample S having been held in the sample holder 21 becomes capable of being precisely position-controlled with the intersection point S3 placed in the rotation center 27*a* of the rotation support part 27 being made a reference point P1.

If the mounting of the sample holder 21 has completed, next, the inside 2*a* of the sample chamber 2 is exhausted by the exhaust means not shown in the drawing, thereby being made a higher vacuum state. And, as shown in FIG. 1 and FIG. 2, under this state, the working of the sample S is performed by irradiating the focused ion beam B to the sample S by the body tube 3. By driving the two-axis stage 4 on the basis of position information in which the reference point P1 is made a reference, it is possible to precisely position-adjust such that the irradiation position B1 becomes a predetermined working position.

Here, by heat generated from a motor, not shown in the drawings, provided in the focused ion beam of apparatus 1 and by the adiabatic expansion of the gas when the inside 2*a* of the sample chamber 2 is vacuumed or the like, the temperature environments of the inside 2*a* of the sample chamber 2 and the outside 8 are different. Therefore, when the sample holder 21 is carried from the outside 8 to the inside 2*a* of the sample chamber 2 and, further, just after the sample holder 21 has been mounted to the base 22, a temperature of the sample holder 21 changes until it becomes thermally equilibratory with the temperature environment inside 2a of the sample chamber 2, so that sample holder 21 itself expands or contracts. On this occasion, the sample holder 21 is supported by the rotation support part 27 so as to be rotatable with respect to the base 22. Further, it is supported by the slide support part 28 so as to be slidable in the X-direction from the rotation center 27a of the rotation support part 27. Additionally, it is supported by the butting support part 29 so as to be slidable in the X-direction and the Y-direction. Therefore, when accompanied by a change in temperature, there is no fact that a reaction force acts, and the sample holder 21 can freely deform with the rotation support part 27 being made a center.

Further, the X-direction positioning pin 31 and the Y-direction positioning pin 32 of the upper face 21a of the sample holder 21, are displaced respectively in the Y-direction and the X-direction toward the rotation center 27a of the rotation support part 27. That is, even if the sample holder 21 has expanded or contracted due to temperature change, since the X-direction positioning pin 31 and the Y-direction positioning pin 32 merely slide respectively with respect to the one side S1 and the other side S2 of the sample S, against which they butt, the sample S is parallel to the Y-direction in its one side S1 and parallel to the X-direction in its other side S2, and the intersection point S3 between the one side S1 and the other side S2 can always keep a position becoming approximately the same as the rotation center 27a of the rotation support part 27. Therefore, in this focused ion beam apparatus 1, even if the sample holder 21 has expanded or contracted due to temperature change, the position control is precisely performed with the intersection point S3 of the sample S being made as the reference point P1 and, further, the working of the sample S can be precisely performed without generating a phenomenon such as the drift in which the position of the sample changes.

Figure 5:
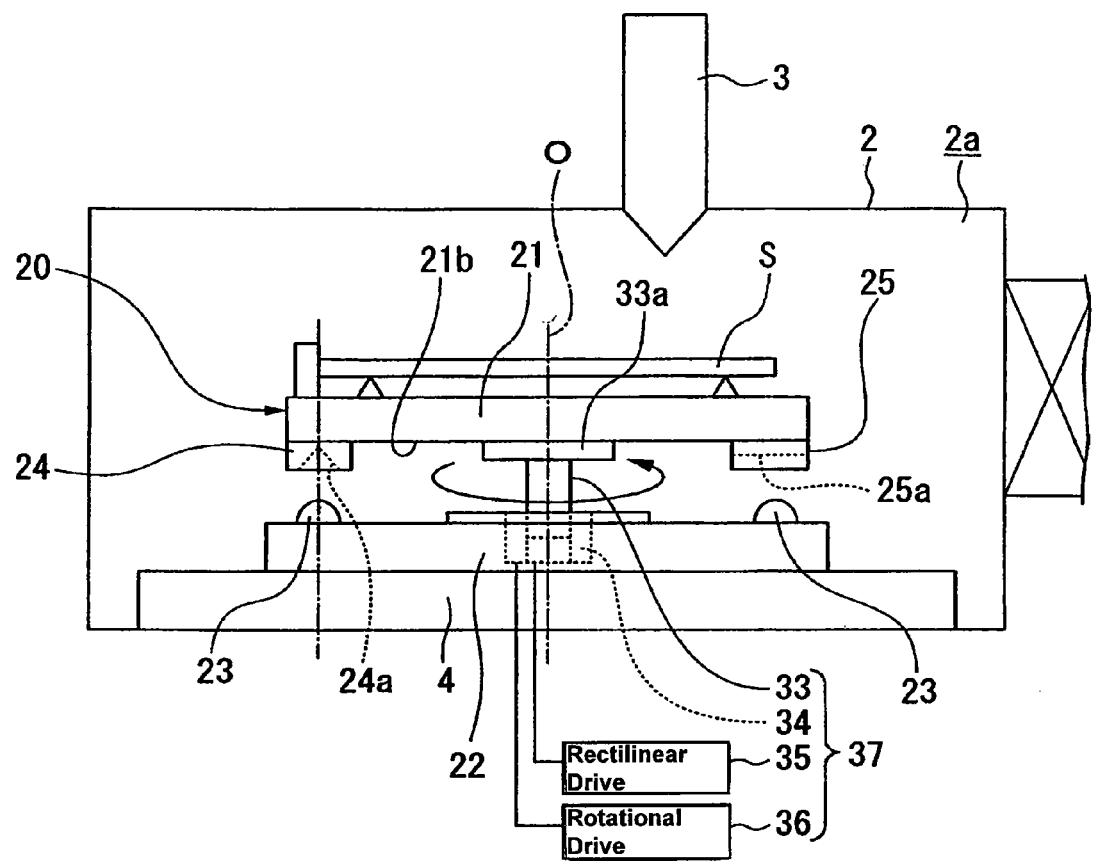
FIG. 5 is an explanatory view of a focused ion beam apparatus of the first embodiment of this invention.
Figure 6:
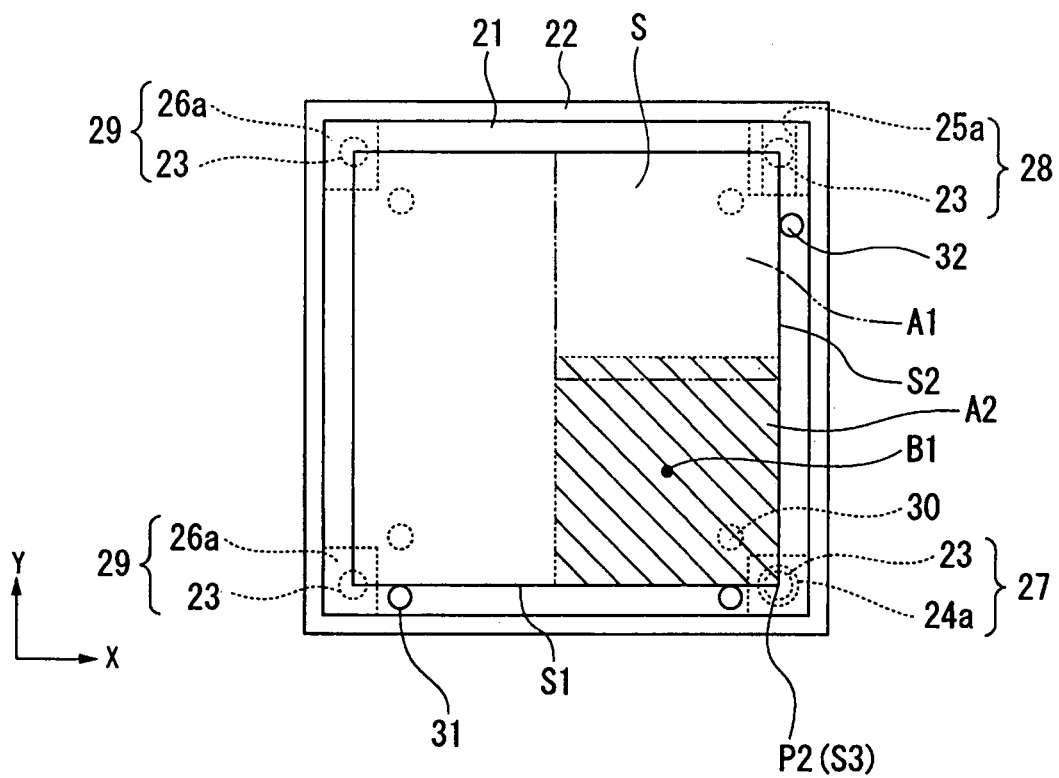
FIG. 6 is an explanatory view of the sample holding mechanism of the first embodiment of this invention.

Incidentally, as shown in FIG. 2, as a first time process, the sample S is moved by the two-axis stage 4 as to a range A1 that is a range somewhat larger than a quarter with respect to the whole of the sample S, thereby performing the working. And, if all the work has been completed as per range A1, the sample S is rotated by 90 degrees. That is, as shown in FIG. 5, the rectilinear movement drive part 35 of the ascent-and-descent rotation means 37 is driven, thereby moving the shaft 33 upward. And, a support plate 33a having been provided in an upper end part of the shaft 33 is butted against the lower face 21b of the sample holder 21, and the sample holder 21 is pushed up and separated from the base 22. Next, the rotation drive part 36 is driven, thereby rotating clockwise the shaft 33 around the center O by 90 degrees. The rectilinear movement drive part 35 is then driven again, thereby causing the shaft 33 to descend. The four convex parts 23 are disposed at the four corners of the square defined in the upper face 22a of the base 22 and, its center O, the shaft 33 is provided. Further, the fitting concave part 24a, the fitting groove 25a and the butting face 26a, which correspond to the convex parts 23, are also disposed like the square correspondingly. Therefore, as shown in FIG. 6, by rotating the sample holder 21 by 90 degrees by the shaft 33 of the ascent-and-descent rotation means 37 to thereby cause it to descend, the fitting concave part 24a, the fitting groove 25a and the butting face 26a of the sample holder 21 respectively fit to and butt against the different convex parts 23 and become states having been positioned.

Incidentally, since the fitting concave part 24a constituting the rotation support part 27 is formed in the sample holder 21, a position of the rotation center 27a of the rotation support part 27 and a position of the intersection point S3 of the sample S can always be kept approximately in the same position when seen in the plane. Therefore, even if the sample holder 21 has been rotated by the ascent-and-descent rotation means 37, there is no fact that the sample S is displaced by undergoing an influence of the temperature change, so that it is possible, with the position of the intersection point S3 of the sample S after the rotation being made a new reference point P2, to perform the position control of the sample S and precisely perform the work of sample S as to a range A2. Incidentally, since the reference point when working the range A1 is P1, whereas the reference point when working the range A2 is P2, although the reference positions differ between range A1 and range A2, a correlativity can be kept by having previously measured the distances of both in the X-direction and the Y-direction.

Figure 7:
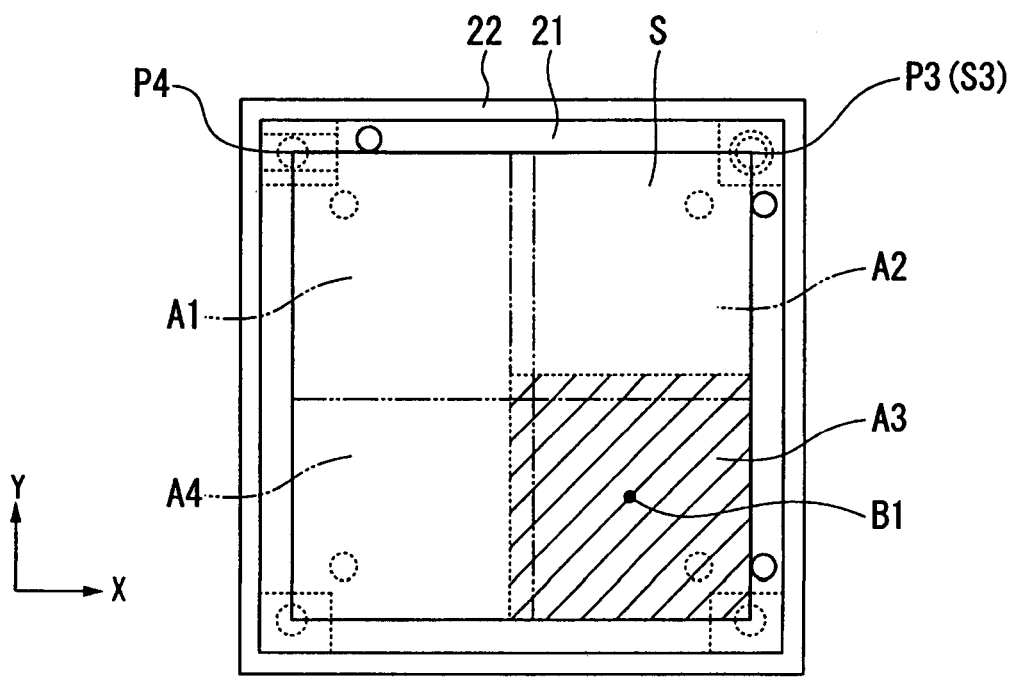
FIG. 7 is an explanatory view of the sample holding mechanism of the first embodiment of this invention.

As shown in FIG. 7, by rotating an additional 90 degrees, it is possible, with P3 being made a reference point, to perform the position control of the sample S and perform the working of a range A3. Further, by rotating an additional 90 degrees and performing the work of range A4 with P4 being made a reference point, it is possible to perform the working of the whole sample S with the sample S being divided to the ranges A1, A2, A3 and A4.

Like the above, according to the sample holding mechanism 20, by supporting the sample holder 21 with respect to the base 22 by the rotation support part 27, the slide support part 28 and the butting support part 29, and by positioning the sample S with respect to the sample holder 21 by the X-direction positioning pin 31 and the Y-direction positioning pin 32, even if the sample holder 21 has expanded or contracted due to the temperature change, the position of the sample S is not changed, so that it is possible to precisely position and hold the sample S. Therefore, even if the sample S has been carried under different temperature environments, there is no fact that a facility or time is required to thermally equilibrate the sample holder 21, so that it is possible to save space and time, and perform a precise position control of the sample. Further, in the focused ion beam apparatus 1 including a similar sample holding mechanism, it is not affected by the temperature change in the outside 8 and the inside 2a of the sample chamber 2, so that it is possible to contrive the saving of space and the saving of time, and perform precise working.

Further, by the fact that the sample holder 21 is detachably supported with the one rotation support part 27, the one slide support part 28 and the two butting support parts 29 being disposed like the square, if the range of at least a quarter of the whole sample S can be worked, it is possible to work the whole of the sample S by dividing the work into four processes. Therefore, it is possible to reduce a moving range by the two-axis stage 4 to thereby contrive miniaturizations of the sample chamber 2 and the two-axis stage 4, and it is possible to correspond to the photomask which has become larger in recent years. Further, by possessing the ascent-and-descent rotation means 37, the sample holder 21 can be easily rotated and mounted to the base 22.

Figure 8:
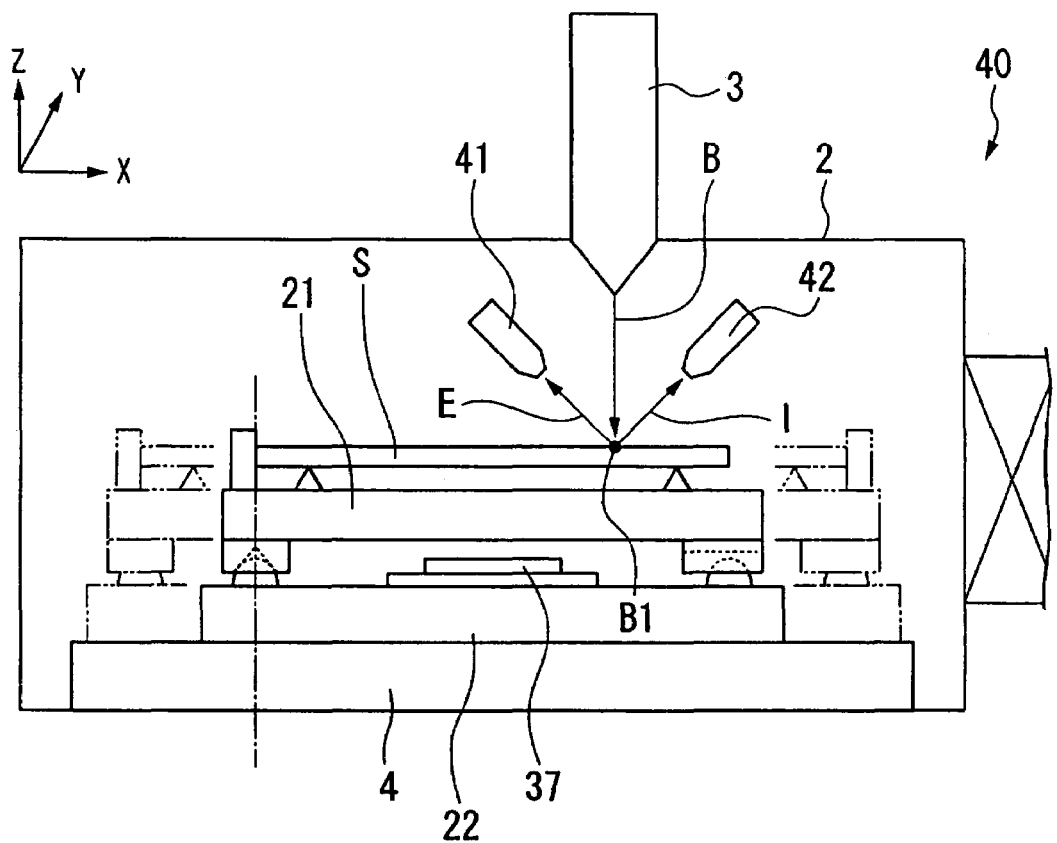
FIG. 8 is a side view of a focused ion beam apparatus of a modified example of the first embodiment of this invention.

FIG. 8 shows a modified example of the present embodiment. A focused ion beam apparatus 40 in this modified example possesses the sample holding mechanism 20, and a secondary electron detector 41 and a secondary ion detector 42 are provided toward the irradiation position B1 of the focused ion beam B. In the focused ion beam apparatus 40, when the focused ion beam B has been irradiated to the sample S, by the secondary electron detector 41 it is possible to detect an intensity of secondary electrons E generated from the irradiation position B1 and, further, by the secondary ion detector 42 it is possible to detect an intensity of secondary ions I generated from the irradiation position B1. And, by the intensity of the secondary electrons E or the intensity of the secondary ions I, which has been detected, it is possible to precisely observe a surface of the sample S.

Although, in the present embodiment, the present invention has been explained with the focused ion beam apparatuses 1, 40 capable of irradiating the focused ion beam B from the body tube 3 as the charged particle beam, it is not limited thereto, and similar effects can also be obtained, e.g., by a scanning electron microscope capable of irradiating an electron beam having the sample holding mechanism 20, whereby it is possible to precisely observe an image of the sample while not influenced by the temperature change.

Second Embodiment

Figure 9:
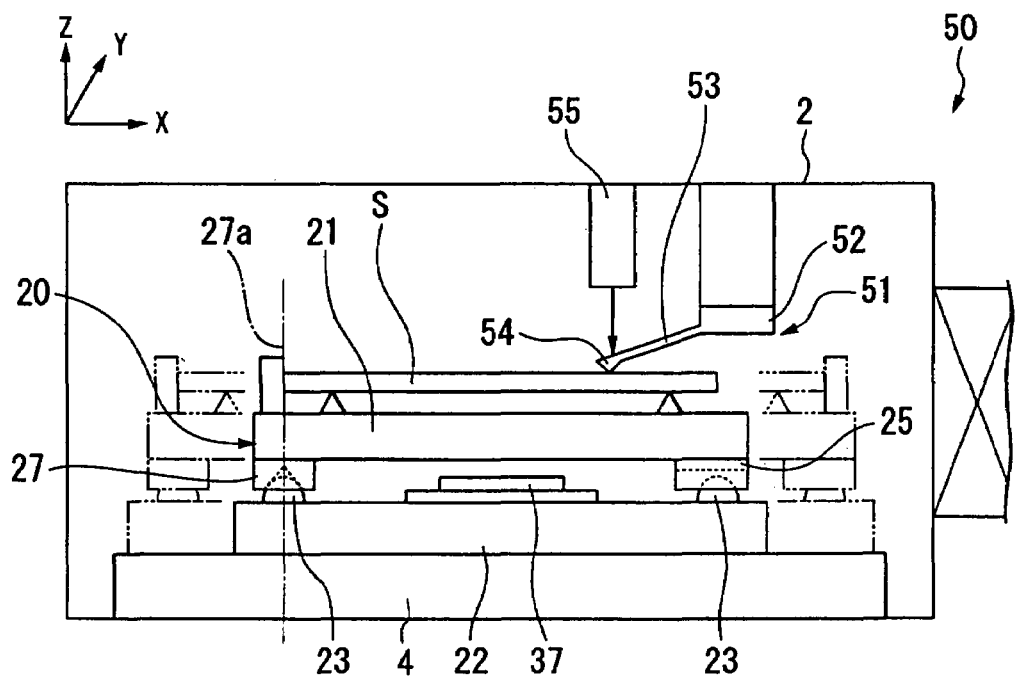
FIG. 9 is a side view of a scanning probe microscope of a second embodiment of this invention.

FIG. 9 shows a second embodiment of the present invention. In this embodiment, the same reference numeral is used to depict the same part in the above-mentioned embodiment, and its explanation is omitted.

As shown in FIG. 9, a scanning probe microscope 50 that is the sample working/observing apparatus includes the sample holding mechanism 20, and contains a probe 51 as a working/observing means. The probe 51 has a support part 52 that has been fixed to the sample chamber 2, a cantilever 53 supported in its base end part by the support part 52 like a cantilever, and an explorer 54 protruding downward at a tip part of the cantilever 53. Further, above the cantilever 53, there is provided a detection part 55 measuring a displacement of the cantilever 53. And, by driving the two-axis stage 4, the explorer 54 of the probe 51 is scanned with respect to the sample S and, by measuring the displacement of the cantilever 53, it is possible to observe the surface of the sample S.

Also in the scanning probe microscope 50, by possessing the sample holding mechanism 20, similar to the first embodiment, since the sample S can be precisely positioned without undergoing the influence of the temperature change, it is possible to obtain the precise observation image of the surface of the sample S. Further, by utilizing the explorer 54, it is possible to work the surface of the sample S.

Although the above embodiments of the present invention have been explained in detail with reference to the drawings, the detailed constitution of the present invention is not limited to these embodiments. It should be noted that a design modification and the like may be made within the scope not deviating from the gist of the present invention.

Although it has been explained that the sample working/observing apparatus may be the focused ion beam apparatuses 1, 40, the scanning electron microscope or the scanning probe microscope 50, it is not limited thereto. An apparatus capable of precisely working or observing the sheet-like sample S can achieve the same effects if it has the sample holding mechanism 20.

Further, in the sample holding mechanism 20, although the sample holder 21 is supported by the four-point support of the rotation support part 27, the slide support part 28 and the two butting support parts 29, it is not limited to this. If it is supported by at least three points of the one rotation support part 27, the one slide support part 28 and at least one butting support part, it is possible to support the sample holder 21 and freely deform the sample holder 21 with the rotation support part 27 being made at the center accompanied the temperature change. Further, although the convex part 23 constituting one of each of the rotation support parts 27, the slide support part 28 and the butting support part 29 are provided in the base 22 and the other fitting concave part 24a, fitting groove 25a and butting face 26a are formed in the sample holder 21, even if the constitution has been reversed, it is possible to support the sample holder with respect to the base 22 and freely deform the sample holder 21 with the rotation support part 27 being made at the center accompanied by the temperature change.

Additionally, although the surface shape of the convex part 23 has been made the spherical face, the corresponding fitting concave part 24a is circular-cone shaped and the fitting groove 25a is v-shaped, but it is not limited to this. For example, the shape of the convex part may be made a circular cone having an apical angle of the circular cone forming the fitting concave part 24a and an apical angle which is an acute angle than a bottom angle of the v-shape forming the section of the fitting groove 25a. Further, as the fitting concave part 24a, it may be one butting at three points against the convex part 23, or it may be made a spherical face whose curvature corresponds to the convex part 23. Further, similarly, also the fitting groove 25a may be made, e.g., a groove of a circular shape in section, whose curvature corresponds to the convex part 23.

Further, although the embodiments have the two X-direction positioning pins 31 and the one Y-direction positioning pin 32 to position the sample 2 to the sample holder 21, they are not limited thereto. For example, the positioning mechanism may be steps formed along the Y-direction and the X-direction from the rotation center of the rotation support part. The positioning mechanism at least has one surface abutting against the one side S1 of the sample S to thereby align the one side S1 parallel to the Y-direction, another surface abutting against the other side S2 of the sample S to thereby align the other side parallel to the X-direction, resulting in that the intersection point S3 of the one side S1 and the other side S2 is generally aligned at the rotation center 27a of the rotation support part 27 when seen in the plane.

What is claimed is:

1. A sample holding mechanism having possessed a sample holder mounting and holding a sheet-like sample on its upper face, and a base detachably supporting the sample holder, comprising:

a rotation support part, a slide support part and at least one butting support part detachably provided respectively between the sample holder and the base, the rotation support part supporting the sample holder so as to be rotatable with respect to the base, the slide support part supporting the sample holder so as to be slidable with respect to the base from a rotation center of the rotation support part toward a predetermined X-direction, and the butting support part supporting the sample holder so as to be slidable with respect to the base in the X-direction and a Y-direction intersecting perpendicularly to the X-direction;

an X-direction positioning member provided in the upper face of the sample holder, and disposed along the Y-direction from the rotation center of the rotation support part and positioning the sample in the X-direction while butting against one side of the sample, and a Y-direction positioning member provided in the upper face of the sample holder, and disposed along the X-direction from the rotation center of the rotation support part and positioning the sample in the Y-direction while butting against the other side adjoining the one side of the sample.

2. A sample holding mechanism according to claim 1, wherein in any one of a lower face of the sample holder and an upper face of the base, a convex part is provided in a position corresponding to each of the rotation support part, the slide support part and the butting support part, in the other of the lower face of the sample holder and the upper face of the base, there are formed respectively a fitting concave part fitting to the convex part so as to be rotatable in a position corresponding to the rotation support part, a fitting groove fitting to the convex part so as to be slidable in the X-direction in a position corresponding to the slide support part, and additionally a butting face butting against the convex part in a position corresponding to the butting support part, and the rotation support part is constituted by the fitting concave part and the corresponding convex part, the slide support part by the fitting groove and the corresponding convex part, and the butting support part by the butting face and the corresponding convex part, respectively.

3. A sample holding mechanism according to claim 2, characterized in that a surface shape of each of the convex parts of the rotation support part, the slide support part and the butting support part is formed in a spherical face, the fitting concave part of the rotation support part is formed like a circular cone capable of fitting to the convex part, and the fitting groove of the slide support part is formed like a V-letter in section, capable of fitting to the convex part.

4. A sample holding mechanism according to claim 2, wherein in the upper face of the base, the convex parts are disposed in four places like a square, and in the lower face of the sample holder, there are disposed the one fitting concave part, the one fitting groove and the two butting faces like the square while corresponding to the convex parts.

5. A sample holding mechanism according to claim 4, characterized in that, in a center of the base, around which the convex parts have been disposed like the square, there is provided an ascent-and-descent rotation means which pushes up the sample holder having been supported by the base by advancing or retreating in a vertical direction, and can rotate the pushed-up sample holder about an axis vertical with respect to the base.

6. A sample working/observing apparatus having possessed a sample holding mechanism according to claim 1, comprising:

a sample chamber in which the sample holding mechanism has been accommodated, a two-axis stage moving the sample holding mechanism having been disposed inside the sample chamber in a horizontal direction, and a working/observing means performing working/observation of the sample having been held by the sample holder of the sample holding mechanism.

7. A sample working/observing apparatus according to claim 6, wherein that the working/observing means is a body tube capable of irradiating a charged particle beam to the sample.

8. A sample working/observing apparatus according to claim 6, wherein the working/observing means is a probe capable of scanning a surface of the sample.

* * * * *